US006549422B1

(12) United States Patent
Mendoza et al.

(10) Patent No.: US 6,549,422 B1
(45) Date of Patent: Apr. 15, 2003

(54) ELECTRONIC SYSTEM FIRE CONTAINMENT AND SUPPRESSION

(75) Inventors: Felipe D. Mendoza, Dallas, TX (US); Michael E. Gomez, Garland, TX (US); Sheldon L. Rohde, Allen, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/750,213

(22) Filed: Dec. 28, 2000

(51) Int. Cl.[7] ................................................. H05K 7/14
(52) U.S. Cl. ....................... 361/796; 361/752; 361/741; 361/756; 174/35 R; 174/51 R; 220/62.22
(58) Field of Search ................................ 361/796, 752, 361/724, 714, 816, 797, 800, 825, 679, 704, 705, 708, 741, 756; 174/35 R, 51 R; 220/62.22, 23.91, 23.87

(56) References Cited

U.S. PATENT DOCUMENTS

| 4,493,173 A | | 1/1985 | Kohaut ......................... 52/221 |
|---|---|---|---|
| 5,617,296 A | * | 4/1997 | Melville et al. ............. 361/736 |
| 5,906,501 A | * | 5/1999 | Longueville et al. ........ 439/327 |
| 5,924,589 A | * | 7/1999 | Gordon .................... 220/23.91 |
| 6,018,126 A | | 1/2000 | Castellani et al. ............. 174/48 |
| 6,130,381 A | | 10/2000 | Keith et al. .............. 174/17 VA |
| 6,309,237 B1 | * | 10/2001 | Longueville ................. 439/267 |
| 6,327,155 B1 | * | 12/2001 | Niepmann et al. ........... 361/757 |

* cited by examiner

*Primary Examiner*—David Martin
*Assistant Examiner*—Hung Bui
(74) *Attorney, Agent, or Firm*—Campbell Stephenson Ascolese LLP

(57) ABSTRACT

An electronic system fire containment and suppression apparatus that can include but is not limited to at least one PCB-localized fire containment and suppression structure which can include at least one printed circuit board (PCB) guide rail having at least one intumescent-paint-coated aperture. A communication device, such as a network router or switch, wherein the electronic system fire containment and suppression apparatus is deployed. A method of deploying the electronic system fire containment and suppression apparatus in a communication device. A method of manufacturing the electronic system fire containment and suppression apparatus.

5 Claims, 6 Drawing Sheets

ELECTRONIC SYSTEM FIRE CONTAINMENT AND SUPPRESSION

BACKGROUND OF THE INVENTION

1. Field of the Invention

The present invention relates, in general, to fire containment and suppression in electronic systems.

2. Description of the Related Art

Complex modern electronic systems, such as network routers and/or switches, often contain many thousands of electronic components. These electronic components typically generate heat and are often themselves flammable. Consequently, fire containment and suppression within electronic systems is a constant concern within the electronics industry.

Fire containment and suppression is such a concern within the industry that standards have arisen which provide consumers with a measure of the relative fire containment and suppression capabilities of various electronic systems. One example of such a fire containment and suppression standard is the Telecordia GR-063-CORE standard.

Industry standards for fire containment and suppression have become very important to consumers. Products failing to meet compliance standards are not commercially viable, because such products are often difficult or impossible to sell to consumers. Consequently, it is desirable that products comply with industry-wide fire containment and suppression standards.

Unfortunately, as electronic component densities for electronic systems have risen, it has become more difficult for electronic systems to meet industry fire containment and suppression standards. This is due, at least in part, to the increased heat generation of the more dense systems, as well as the closer proximity of the flammable electronic components in the more dense systems.

It is, therefore, apparent that a need exists for an improved method and apparatus for fire containment and suppression, such method and apparatus proving particularly useful in dense electronic component environments.

SUMMARY OF THE INVENTION

The inventors named herein have devised methods and apparatuses for fire containment and suppression. The devised methods and apparatuses prove particularly useful in dense electronic component environments.

In one embodiment, an electronic system fire containment apparatus can include but is not limited to at least one PCB-localized fire containment structure including at least one printed circuit board (PCB) guide rail having at least one intumescent-paint-coated aperture.

In one embodiment, a communication device can include but is not limited to at least one processor mounted on at least one printed circuit board (PCB), where the PCB is positioned by an electronic system fire containment apparatus, where the apparatus can include but is not limited to at least one PCB-localized fire containment structure which can include at least one printed circuit board (PCB) guide rail having at least one intumescent-paint-coated aperture.

In one embodiment, a method of fire containment can include but is not limited to deploying an electronic system fire containment apparatus into a communication device.

In one embodiment a method of manufacture can include but is not limited to affixing at least one printed circuit board (PCB) guide rail having at least one intumescent-paint-coated aperture proximate to a PCB.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of this patent application will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
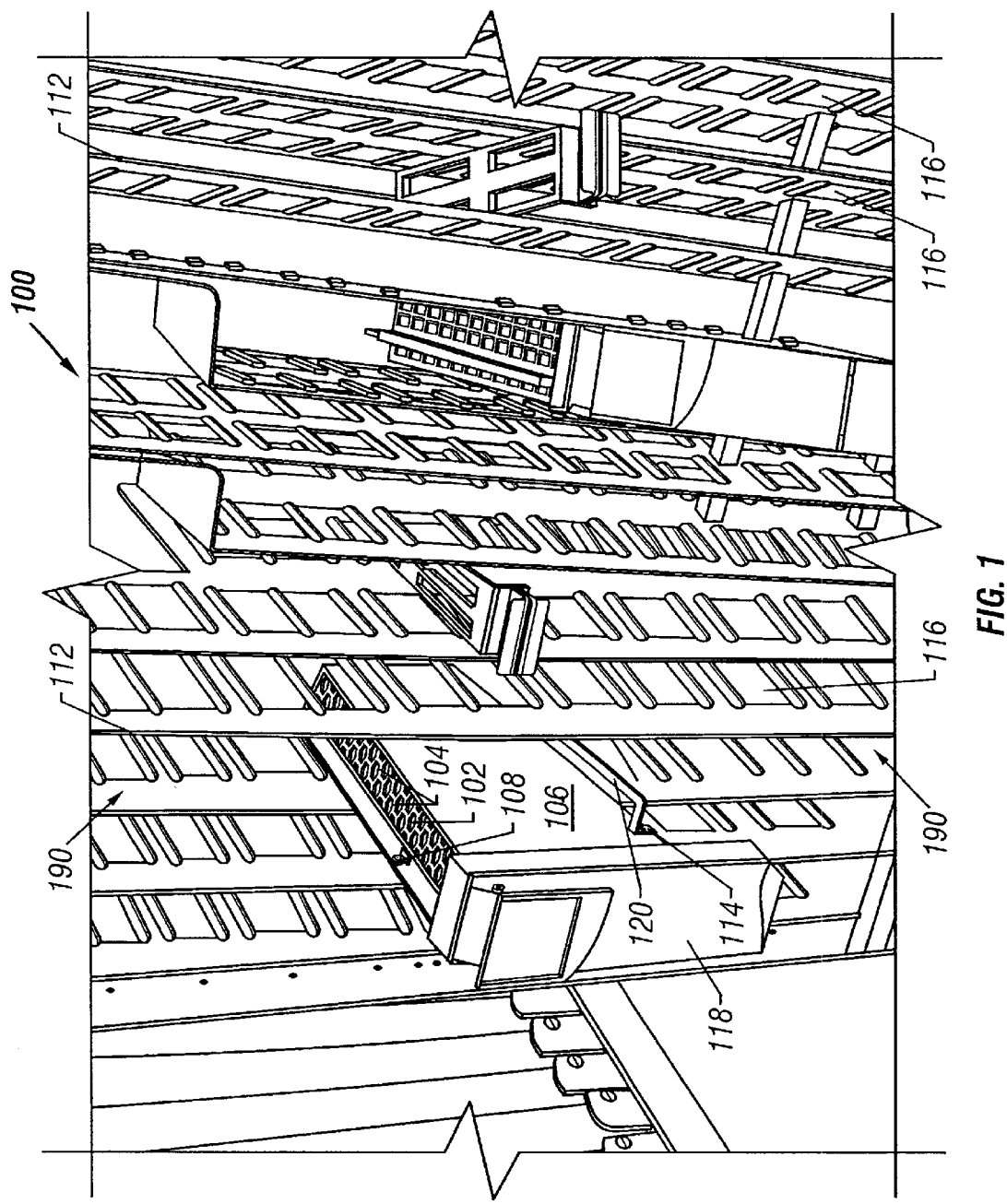
FIG. 1 illustrates electronic system fire containment and suppression apparatus (ESFCSA) 100.

With reference to the figures, and with reference now to FIG. 1, shown is electronic system fire containment and suppression apparatus (ESFCSA) 100. Depicted is that ESFCSA 100 includes PCB-localized fire containment and suppression structure 150 which includes printed circuit board (PCB) guide rail 102 having intumescent-paint-coated aperture walls 104. Illustrated is that in one embodiment intumescent-paint-coated aperture walls 104 form apertures hexagonal in shape. While only one PCB-localized fire containment and suppression structure 150 is shown and described herein, it is to be understood that in actual operation many (e.g., forty-eight) PCB-localized fire containment and suppression structures will typically be present within each shelf of each electronics bay (or card cage; as used herein the term "electronics bay" can be interpreted to encompass what is known in the art as a "card bay") wherein one or more electronic system fire containment and suppression apparatuses (such as ESFCSA 100) are deployed. Consequently, when a fire breaks out, such structures will allow fire to be substantially contained and/or suppressed (isolated) at or near the board on which the fire began. The foregoing functioning is one reason why PCB-localized fire containment and suppression structure 150 is referred to as localized, in that it works to effect containment and suppression of fire and/or smoke local to itself.

Shown is that in one implementation printed circuit board (PCB) guide rail 102 having intumescent-paint-coated aperture walls 104 is affixed to printed circuit board (PCB) 106 via screws inserted through screw eyes (e.g., screw eye 108—another screw eye is also present, but is not visible in FIG. 1 in that slot wall 112 is blocking the view of the other screw eye) of printed circuit board (PCB) guide rail 102 having intumescent-paint-coated aperture walls 104.

Further depicted affixed to PCB 106 is PCB guide rail 110 via screw eyes (e.g., screw eye 114—another screw eye is also present, but is not visible in FIG. 1 in that slot wall 112 is blocking the view of the other screw eye). As will be shown below, in one embodiment, there are two additional guide rails on the side of PCB 106 opposite the side shown in FIG. 1 where the two additional rails (similar to PCB guide rail 110) are formed to function in conjunction with PCB guide rail 102 having intumescent-paint-coated aperture walls 104 and PCB guide rail 110 such that PCB 106 is held firmly in position. In operation, PCB guide rail 102 having intumescent-paint-coated aperture walls 104 is supported by PCB 106 in close proximity to a slot wall 112, while PCB guide rail 110, and the two rails on the opposite side of PCB 106 each respectively interface with forms 116 of slot walls 112 such that PCB 106 is held firmly in place. However, other embodiments in which PCB guide rail 102 having intumescent-paint-coated aperture walls 104 interface with a form 116 of a slot wall 112 such that PCB 106 is held firmly in place are also contemplated.

Further illustrated in FIG. 1 is that face plate 118 is affixed to PCB 106. In one embodiment, face plate 118 is used to manipulate PCB-localized fire containment and suppression structure 150 mechanism shown in and out of slot 190 formed by pairs of slot walls 112.

As mentioned in relation to FIG. 1, in one embodiment, ESFCSA 100 includes two additional rails affixed to PCB 106. One implementation of such an embodiment appears in FIG. 2.

Figure 2:
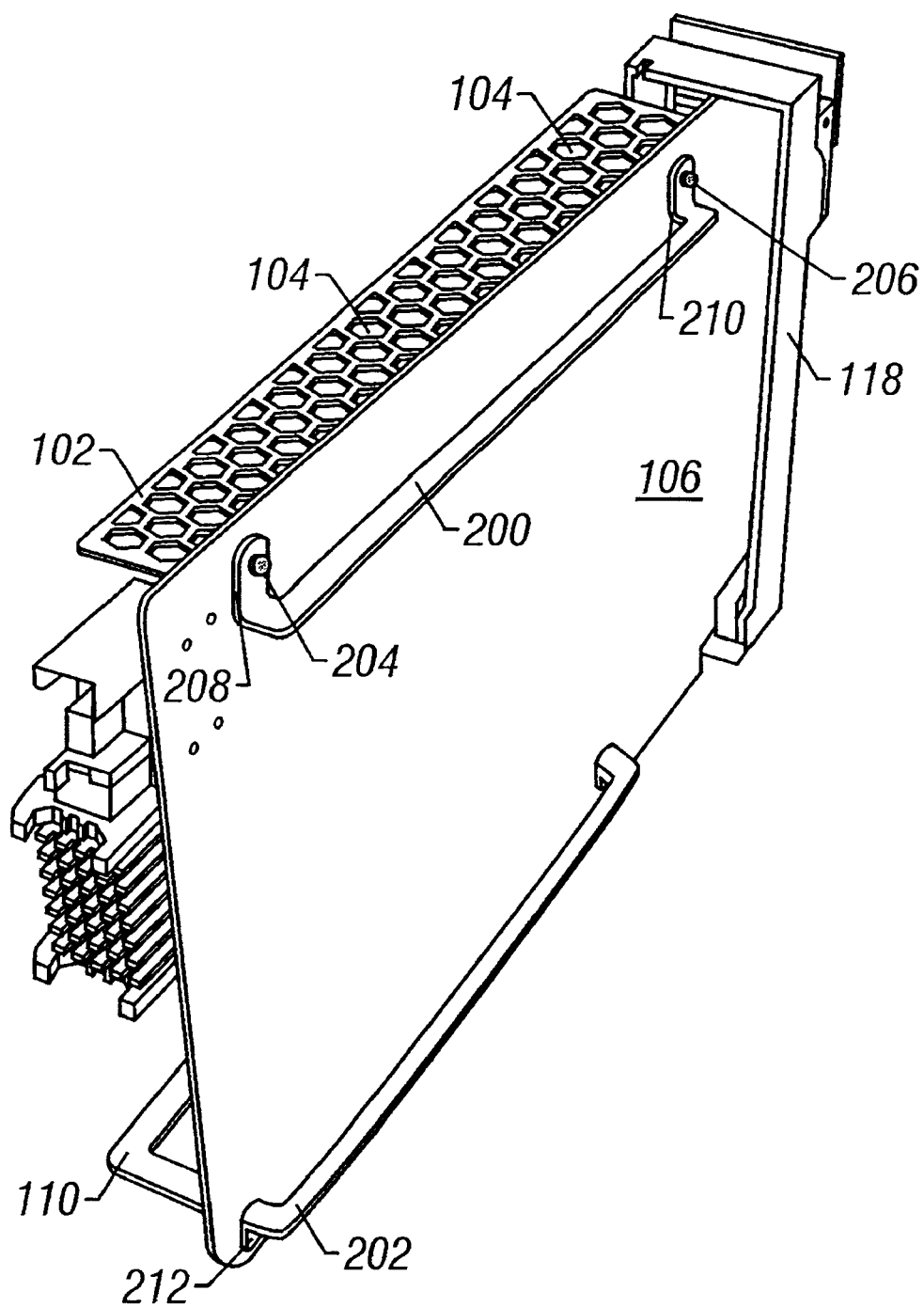
FIG. 2 depicts an alternate perspective view of the side of PCB 106 opposite that shown in FIG. 1.

Referring now to FIG. 2, depicted is an alternate perspective view of the side of PCB 106 opposite that shown in FIG. 1. Illustrated are PCB guide rails 200, 202. Depicted is that PCB guide rail 200 is affixed to PCB 106 via screws 204, 206 protruding through screw eyes 208, 210. Illustrated is that PCB guide rail 202 is affixed by screws through screw eyes (e.g., screw eye 212—another screw eye is also present, but is not visible in FIG. 2 in that PCB guide rail 202 is blocking the view of the other screw eye).

As referenced above, in operation PCB guide rails 200, 202 interface, or mate, with forms 116 (see FIG. 1) to hold PCB 106 firmly in position. This is shown more clearly in FIG. 3.

Figure 3:
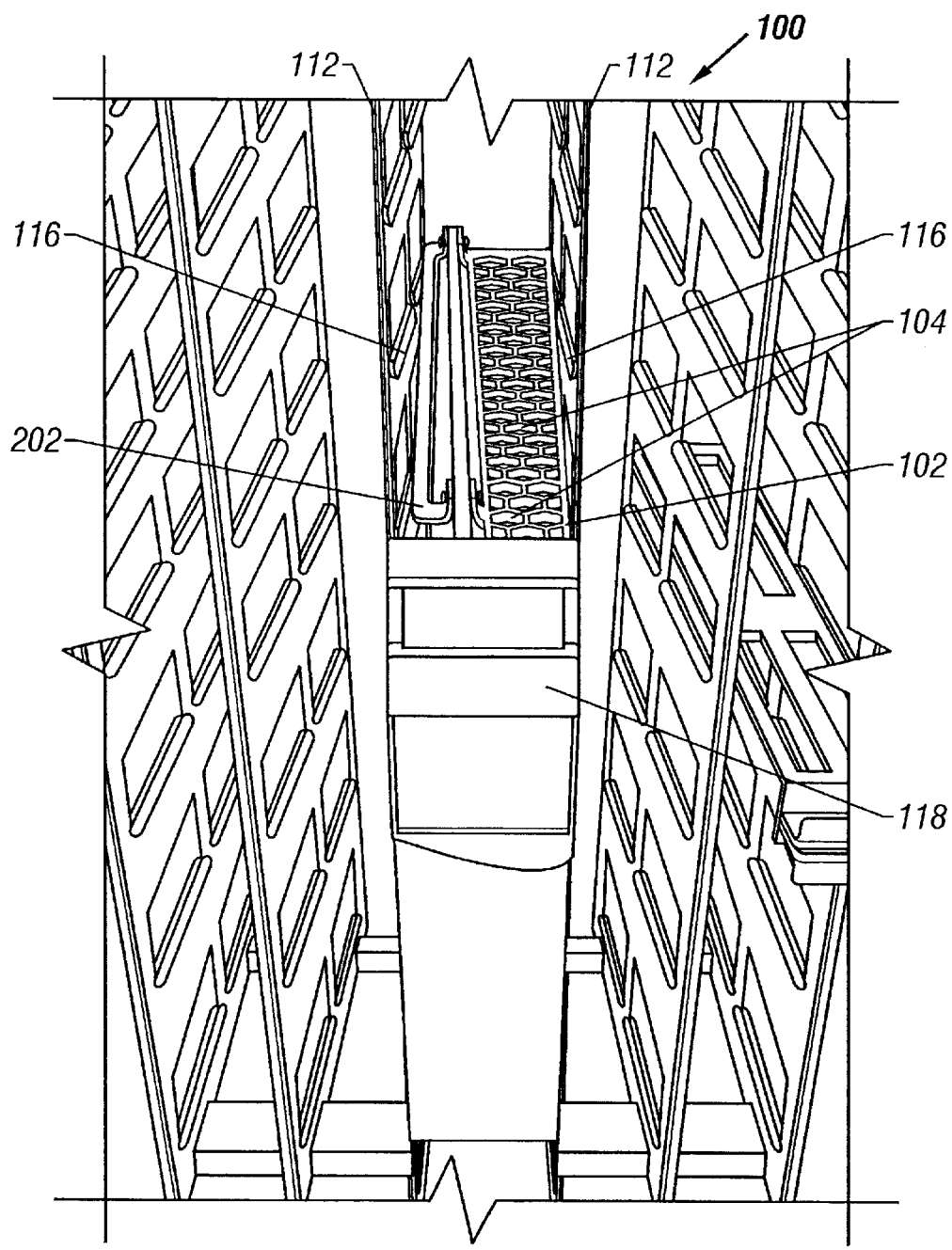
FIG. 3 shows another perspective view of ESFCSA 100.

With reference now to FIG. 3, shown is another perspective view of ESFCSA 100. Depicted is PCB guide rail 102 having intumescent-paint-coated aperture walls 104 suspended substantially proximate to two forms 116 of the right-hand slot wall 112 (in another contemplated embodiment PCB guide rail 102 having intumescent-paint-coated aperture walls 104 seats within two forms 116 of the right-hand slot wall 112). Illustrated is PCB guide rail 202 seated within two forms 116 of the left-hand slot wall 112. In addition, although not visible due to the angle of view, guide rails 202 and 110 are also present and also respectively interface with forms 116 on the left-hand slot wall 112 and the right-hand slot wall 112.

Figure 4:
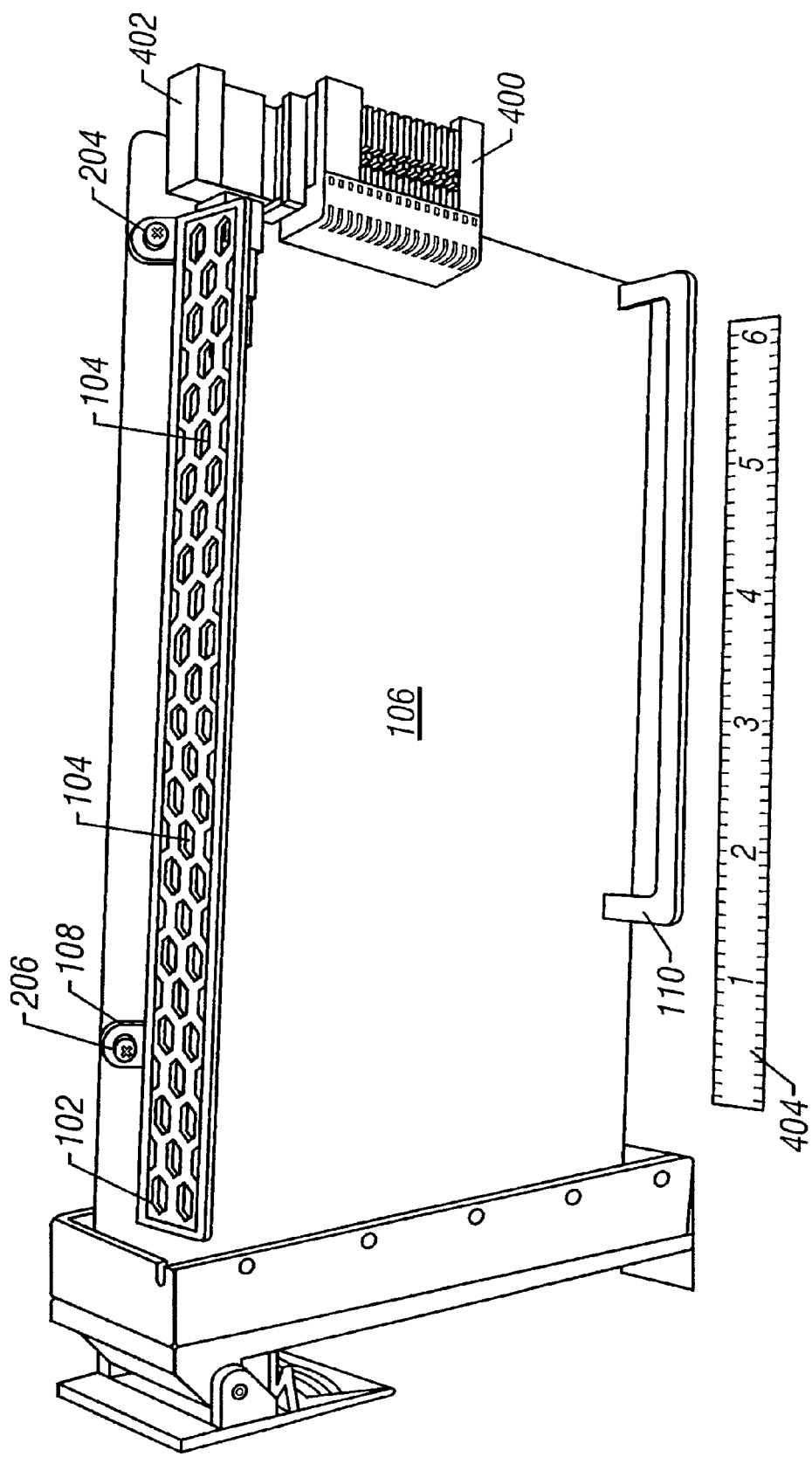
FIG. 4 illustrates another perspective view of PCB 106 having affixed to it PCB guide rail 102 having intumescent-paint-coated aperture walls 104 and PCB guide rail 110.

Referring now to FIG. 4, shown is another perspective view of PCB 106 having affixed to it PCB guide rail 102 having intumescent-paint-coated aperture walls 104 and PCB guide rail 110. Also shown are board edge connector 400 and fiber optic connector 402. Depicted is 6 inch ruler 404, which is also depicted in FIGS. 1–3, and which can be used to determine the exact scale of all items shown in FIGS. 1–4, and 6, herein.

In operation, the devices described herein function to provide fire and smoke containment and suppression sufficient to meet industry standards (e.g., such as fire and smoke control standard promulgated by Bellcore). That is, when temperatures proximate to PCB guide rail 102 having intumescent-paint-coated aperture walls 104 become sufficiently high (e.g., 280 degrees Centigrade) to activate the intumescent paint, the intumescent paint expands rapidly to form a virtually airtight seal between intumescent-paint-coated aperture walls 104 and between PCB 106 and between slots 112. Consequently, such sealing off compartmentalizes, contains, and suppresses fire and/or smoke near to PCB guide rail 102 having intumescent-paint-coated aperture walls 104. In the embodiment depicted in FIG. 1, it has been found that PCB guide rail 102 having intumescent-paint-coated aperture walls 104 performs well when air flow is kept below 600 linear feet per minute (LPM), and performs particularly well at about 300 LPM.

With respect to FIGS. 1 and 3, those skilled in the art will recognize that ESFCSA 100 is particularly useful when forming part of an electronics bay, such as that utilized in a router, switch, or computer. One example of a router wherein ESFCSA 100 proves particularly useful is shown in FIG. 5.

Those skilled in the art will recognize that it is common within the art to describe devices and/or processes in the fashion set forth herein, and thereafter use standard engineering practices to integrate such described devices and/or processes into an electronics system. That is, the devices and/or processes described above can be integrated into an electronic system via a reasonable amount of experimentation. FIG. 5 shows an example representation of an electronic system into which the described devices and/or processes may be integrated with a reasonable amount of experimentation.

Figure 5:
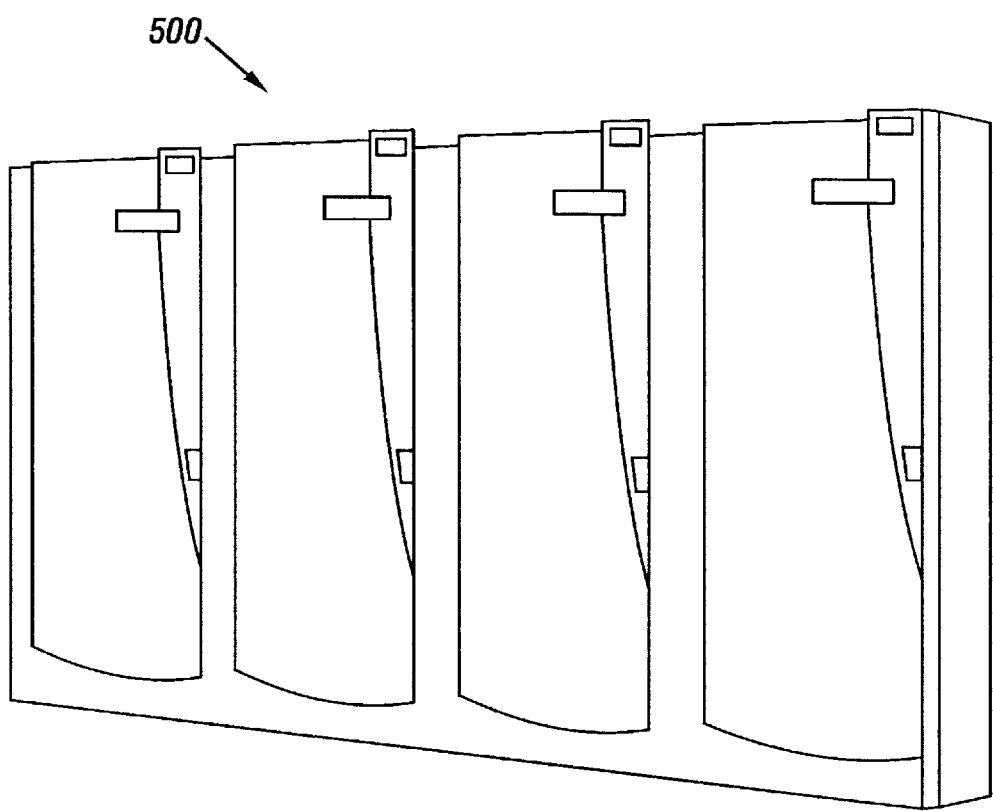
FIG. 5 depicts a pictorial representation of a conventional electronic system in which illustrative embodiments of the devices and/or processes described herein may be implemented.

With reference now to FIG. 5, depicted is a pictorial representation of a conventional electronic system in which illustrative embodiments of the devices and/or processes described herein may be implemented; specifically, depicted is Cisco Systems' ONS 15900 series Wavelength Router 500 (Cisco Systems, ONS 15900, and Wavelength Router are all marks used and owned by Cisco Systems of San Jose, Calif.). Insofar as Cisco Systems' ONS 15900 series Wavelength Router 500 uses hundreds of printed circuit boards, ESFCSA proves particularly useful in such an environment, in that the thousands of processors and storage devices resident on Cisco Systems' ONS 15900 series Wavelength Router 500's printed circuit boards create a great need for fire containment and suppression. Although Cisco Systems' ONS 15900 series Wavelength Router 500 is specifically depicted and described herein, those skilled in the art will recognize that Cisco Systems' ONS 15900 series Wavelength Router 500 is exemplary of network routers, switches, and other systems having electronics bays.

As noted, network routers, such as Cisco Systems' ONS 15900 series Wavelength Router 500, typically have thousands of processors and storage devices dispersed across many circuit boards therein. A simple example of representative of printed circuit boards containing such processors and storage devices is shown in FIG. 6.

Figure 6:
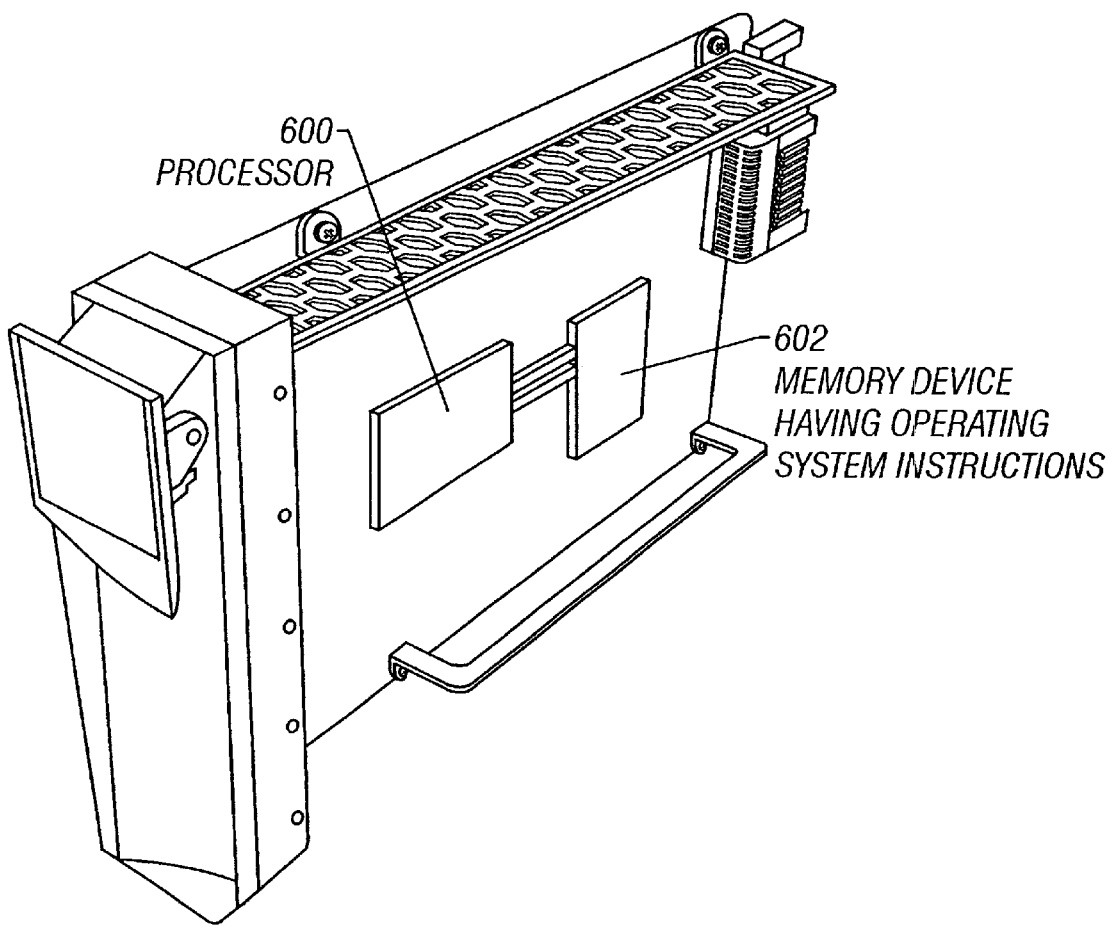
FIG. 6 shows a perspective view of PCB-localized fire containment and suppression structure 150, such as shown and described above in relation to FIGS. 1–4.

Referring now to FIG. 6, depicted is a perspective view of PCB-localized fire containment and suppression structure 150, such as shown and described above in relation to FIGS. 1–4. Shown on PCB 106 are processor 600 and memory device 602, which are meant to be indicative of virtually any circuitry which can be placed on PCB 106 (e.g., such as the thousands of processors and storage devices of Cisco Systems' ONS 15900 series Wavelength Router 500). Illustrated is that memory device 602 has resident within it instructions, which in one embodiment can be part or all of a network operating system such as Cisco Systems' Network Operating System (relatively expensive software/firmware which is also typically present in most network routers/switches).

As is apparent at this point, but which will be explicitly set forth here for sake of clarity, the devices described herein can be used to implement a method of fire containment and suppression. In one embodiment, this method includes deploying ESFCSA 100 communications device (e.g., a switch or a router). One such communications device wherein such deployment provides particularly good fire containment and suppression is Cisco Systems' ONS 15900 series Wavelength Router 500. In one embodiment, the deploying includes inserting at least one PCB-localized fire containment and suppression structure into forms of at least one slot of an electronics bay of a communications device (e.g., such as was shown and described in relation to FIGS. 1 and 3).

Those skilled in the art will recognize that the descriptions and figures described herein can also give rise to at least one method of manufacturing ESFCSA 100. In one embodiment, the method of manufacture includes but is not limited to manufacturing at least one PCB-localized fire containment and suppression structure 150. In one embodiment, manufacturing at least one PCB-localized fire containment and suppression structure includes affixing at least one printed circuit board (PCB) guide rail having at least one intumescent-paint-coated aperture proximate to a PCB and affixing at least one other guide rail proximate to the PCB and affixing at least one face plate proximate to the PCB (e.g., affixing 3 other PCB guide rails and the face plate to the PCB as shown and described in relation to FIGS. 1–4). In addition, in one embodiment the method of manufacturing further includes the creation, in whole or in part, of electronics bays having one or more compartments separated by shelves, wherein each compartment has a number of slots having forms to receive guide rails (e.g., forms 116 shown and described in relation to FIGS. 1 and 3 herein).

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such intent is present. For example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to introduce claim elements. In addition, even if a specific number of an introduced claim element is explicitly recited, those skilled in the art will recognize that such recitation should typically be interpreted to mean at least the recited number (e.g., the bare recitation of "two elements," without other modifiers, typically means at least two elements, or two or more elements).

What is claimed is:

1. An electronic system fire containment apparatus, said apparatus comprising:

at least one PCB-localized fire containment structure including at least one printed circuit board (PCB) guide rail having at least one intumescent-paint-coated aperture, wherein a first side of said PCB guide rail is configured to be securely attached to a planar side of a PCB, and a second side of said PCB guide rail is configured to be received by said electronic system fire containment apparatus, said second side being opposite said first side.

2. The electronic system fire containment apparatus of claim 1, further comprising:

at least one face plate affixable to a PCB.

3. The electronic system fire containment apparatus of claim 1, further comprising:

at least one additional PCB guide rail affixable to a PCB.

4. The electronic system fire containment apparatus of claim 1, further comprising:

at least one electronics bay having a slot, said slot having at least one form structured to support at least one PCB.

5. The electronic system of claim 4, wherein said slot having at least one form structured to support at least one PCB, further comprises:

said slot having at least one form structured to support at least one PCB guide rail.

* * * * *